United States Patent
Nomura et al.

(10) Patent No.: US 7,985,675 B2
(45) Date of Patent: Jul. 26, 2011

(54) METHOD FOR FABRICATING A SEMICONDUCTOR DEVICE THAT INCLUDES PROCESSING AN INSULATING FILM TO HAVE AN UPPER PORTION WITH A DIFFERENT COMPOSITION THAN AN OTHER PORTION

(75) Inventors: Kotaro Nomura, Toyama (JP); Makoto Tsutsue, Shiga (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 12/251,984

(22) Filed: Oct. 15, 2008

(65) Prior Publication Data
US 2009/0121359 A1 May 14, 2009

(30) Foreign Application Priority Data
Nov. 9, 2007 (JP) ................. 2007-291561

(51) Int. Cl.
*H01L 21/4763* (2006.01)

(52) U.S. Cl. .. 438/631; 438/675; 438/783; 257/E21.576
(58) Field of Classification Search ................... 438/677
See application file for complete search history.

(56) References Cited

U.S. PATENT DOCUMENTS

| | | | |
|---|---|---|---|
| 2001/0010970 A1* | 8/2001 | Uglow et al. | 438/622 |
| 2004/0061236 A1 | 4/2004 | Koide | |
| 2004/0089924 A1 | 5/2004 | Yuasa et al. | |
| 2004/0135255 A1 | 7/2004 | Matsunaga et al. | |
| 2005/0023689 A1 | 2/2005 | Nicholson et al. | |
| 2005/0064699 A1 | 3/2005 | Kondo et al. | |
| 2005/0161827 A1* | 7/2005 | Andideh et al. | 257/760 |
| 2005/0167844 A1 | 8/2005 | Ohto et al. | |
| 2005/0263857 A1 | 12/2005 | Yuasa et al. | |
| 2006/0175705 A1 | 8/2006 | Tsutsue et al. | |

FOREIGN PATENT DOCUMENTS

| | | |
|---|---|---|
| JP | 2004-146798 | 5/2004 |
| JP | 2005-051214 | 2/2005 |

* cited by examiner

*Primary Examiner* — Stephen W Smoot
(74) *Attorney, Agent, or Firm* — McDermott Will & Emery LLP (57) ABSTRACT

A semiconductor device includes: a semiconductor substrate; a first insulating film (third insulating film 24) formed on the semiconductor substrate, having a first trench (second interconnect trench 28), and having a composition ratio varying along the depth from an upper face of the first insulating film; and a first metal interconnect (second metal interconnect 25) filling the first trench (second interconnect trench 28). The mechanical strength in an upper portion of the first insulating film (third insulating film 24) is higher than that in the other portion of the insulating film (third insulating film 24).

20 Claims, 6 Drawing Sheets

|  | without UV irradiation | with UV irradiation |
|---|---|---|
| defect density (pcs./cm²) | 100 | 0.3 |

METHOD FOR FABRICATING A SEMICONDUCTOR DEVICE THAT INCLUDES PROCESSING AN INSULATING FILM TO HAVE AN UPPER PORTION WITH A DIFFERENT COMPOSITION THAN AN OTHER PORTION

BACKGROUND OF THE INVENTION (1) Field of the Invention

The present invention relates to semiconductor devices including metal interconnections of, for example, copper and methods for fabricating the semiconductor devices.

(2) Background Art

With recent increase in integration degree of semiconductor integrated circuits, interconnect patterns come to have higher densities, and thus parasitic capacitance between interconnects has increased. The increase in parasitic capacitance causes an interconnect delay of signals. Therefore, reduction of the parasitic capacitance between interconnects is an important issue in semiconductor integrated circuits that need to operate at high speed. To reduce the parasitic capacitance between interconnects, reductions of a relative dielectric constant between interconnects and a relative dielectric constant of an interlayer insulating film are currently studied.

A silicon dioxide ($SiO_2$) film (relative dielectric constant: 3.9 to 4.2) has been conventionally used as a material for an insulating film provided between interconnects in many cases. In some semiconductor integrated circuits, the relative dielectric constant of an insulating film is reduced by using a fluorine (F)-containing $SiO_2$ film (relative dielectric constant: 3.5 to 3.8). In addition, a semiconductor device in which a low-dielectric-constant film (hereinafter, referred to as a low-κ film) of a carbon-containing silicon oxide film (i.e., a SiOC film) having a relative dielectric constant of three or less is used as an insulating film between interconnects in order to reduce parasitic capacitance between interconnects is currently proposed.

However, when a low-κ film made of SiOC is used as an insulating film between interconnects, low film strength of the low-κ film causes a problem in which the SiOC film suffers from physical damage in a chemical mechanical polishing (CMP) process for forming an interconnect. To avoid this, a method of forming, for example, a protective film (i.e., a CMP damage preventing film) which is not susceptible to damage, on a low-strength film such as a SiOC film is proposed (see, for example, Japanese Laid-Open Patent Publication Nos. 2004-146798 and 2005-051214). In general, a low-κ film is susceptible to damage and, thereby, increases its dielectric constant during dry etching and ashing. The use of the CMP damage preventing film described above is also effective to prevent this increase.

Figure 7:
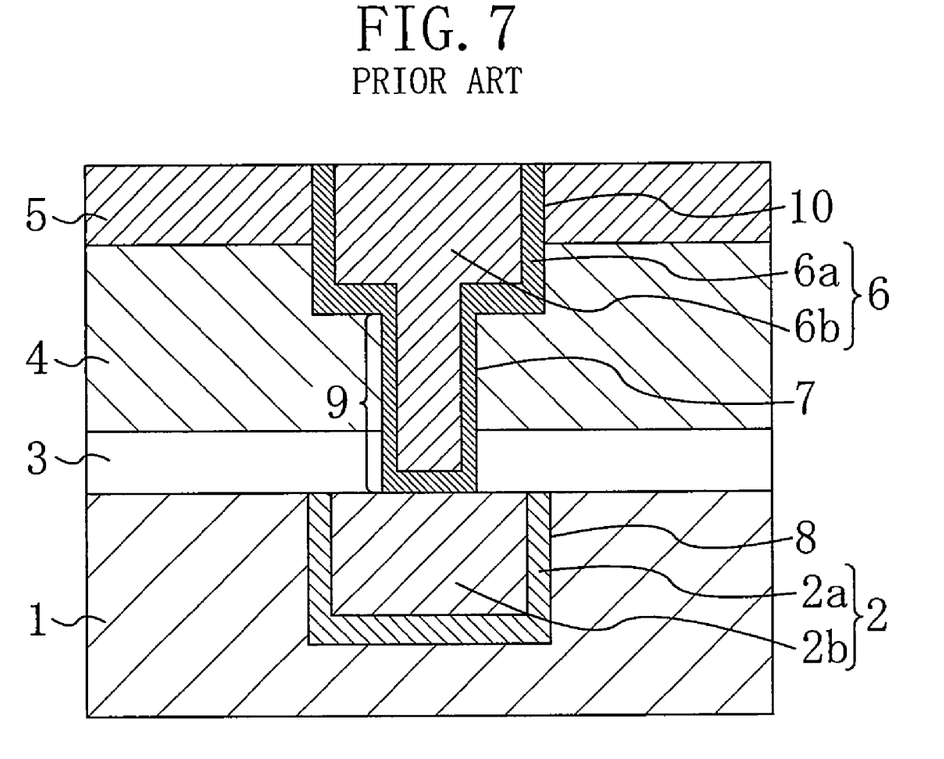
FIG. 7 is a cross-sectional view illustrating a structure of a conventional semiconductor device.

Now, a conventional semiconductor device will be described with reference to FIG. 7. FIG. 7 is a cross-sectional view illustrating an example of a semiconductor device using a SiOC film as an insulating film between interconnects.

As illustrated in FIG. 7, the conventional semiconductor device includes: a first insulating film 1 formed on a substrate (not shown), having a first interconnect trench 8 at its upper portion and made of, for example, a $SiO_2$ film; a first metal interconnect 2 formed on the inner face of the first interconnect trench 8 and constituted by a barrier metal 2a of, for example, tantalum nitride (TaN) and a conductive film 2b formed on the barrier metal 2a to fill the first interconnect trench 8 and made of, for example, copper (Cu); a second insulating film 3 formed on the first insulating film 1 and the first metal interconnect 2 and made of, for example, silicon carbide (SiC); a third insulating film 4 formed on the second insulating film 3 and made of a low-κ film such as a SiOC film; and a fourth insulating film 5 formed on the third insulating film 4 and made of, for example, $SiO_2$. A via hole 7 is formed in the second insulating film 3 and a lower portion of the third insulating film 4. A second interconnect trench 10 is formed in the fourth insulating film 5 and an upper portion of the third insulating film 4 and is connected to the via hole 7. The conventional semiconductor device further includes: a metal via 9 constituted by a barrier metal 6a made of, for example, TaN and formed on the inner face of the via hole 7 and a conductive film 6b made of, for example, Cu; and a second metal interconnect 6 constituted by the barrier metal 6a formed on the inner face of the second interconnect trench 10 and the conductive film 6b and connected to the first metal interconnect 2 via the metal via 9.

Now, a conventional method for fabricating a semiconductor device with the foregoing structure will be described with reference to FIGS. 8A through 8D. FIGS. 8A through 8D are cross-sectional views showing the conventional method for fabricating a semiconductor device.

Figure 8A:
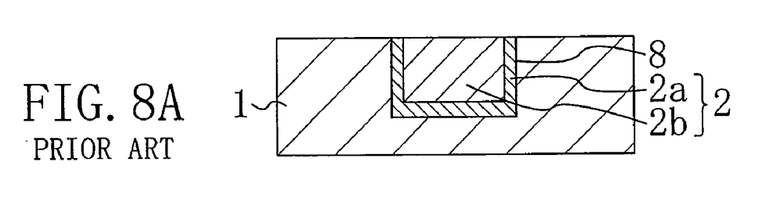
FIGS. 8A through 8D are cross-sectional views showing a conventional method for fabricating a semiconductor device.

First, as shown in FIG. 8A, a first insulating film 1 made of, for example, $SiO_2$ is formed on a substrate (not shown), and then an interconnect trench pattern is formed on the first insulating film 1 by photolithography. Thereafter, the first insulating film 1 is selectively etched by dry etching, thereby forming a first interconnect trench 8. Subsequently, a barrier metal 2a made of, for example, TaN is formed on the inner face of the first interconnect trench 8, and then a conductive film 2b made of, for example, Cu is deposited on the barrier metal 2a to fill the first interconnect trench 8. Then, redundant Cu is removed by chemical mechanical polishing (CMP), thereby forming a first metal interconnect 2 constituted by the barrier metal 2a and the conductive film 2b.

Figure 8B:
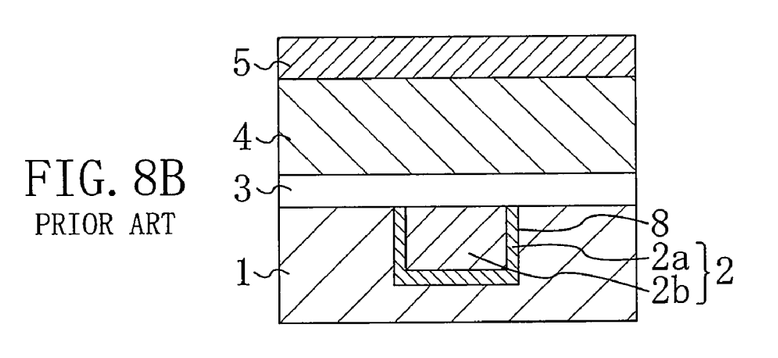

Next, as shown in FIG. 8B, a second insulating film 3 made of, for example, SiC is deposited over the first insulating film 1 and the first metal interconnect 2 to a thickness of 50 nm. Subsequently, a third insulating film 4 of a low-κ film such as a SiOC film is deposited over the second insulating film 3 to a thickness of 500 nm, and then a fourth insulating film 5 made of, for example, $SiO_2$ is deposited by plasma CVD over the third insulating film 4 to a thickness of 50 nm.

Figure 8C:
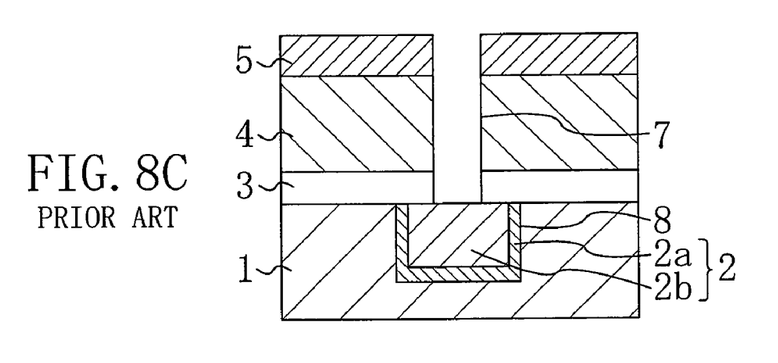

Thereafter, as shown in FIG. 8C, a hole pattern is formed on the fourth insulating film 5 by photolithography, and then the second insulating film 3, the third insulating film 4 and the fourth insulating film 5 are selectively etched by dry etching, thereby forming a via hole 7 in which the upper face of the first metal interconnect 2 is exposed.

Figure 8D:
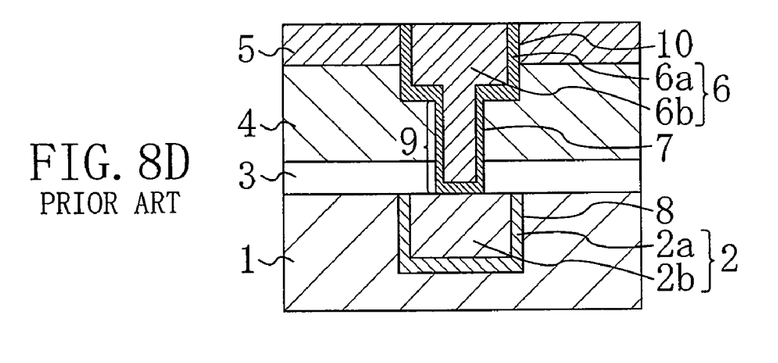

Thereafter, as shown in FIG. 8D, a mask is formed on the third insulating film 4, and then an upper portion of the third insulating film 4 and a portion of the fourth insulating film 5 surrounding the via hole 7 are selectively removed by dry etching, thereby forming a second interconnect trench 10 having a given shape. Subsequently, a barrier metal 6a made of, for example, TaN is formed on the inner faces of the second interconnect trench 10 and the via hole 7, and then a conductive film 6b made of, for example, Cu is deposited on the barrier metal 6a to fill the via hole 7 and the second interconnect trench 10. Then, redundant Cu is removed by CMP, thereby forming a metal via 9 and a second metal interconnect 6 constituted by the barrier metal 6a and the conductive film 6b at a time.

In the conventional method for fabricating a semiconductor device, the fourth insulating film 5 is provided as a CMP damage preventing film. Thus, it is possible to prevent the third insulating film 4 from being damaged during CMP in the process step shown in FIG. 8D.

SUMMARY OF THE INVENTION

However, the third insulating film 4 of a low-κ film such as a SiOC film exhibits a weak adherence to a film made of a different material at the interface therebetween. Accordingly, in fabricating a semiconductor device, mechanical stress applied during a CMP process and a wafer dicing process and resin shrinkage stress applied within a resin package might cause a peeling at the interface between SiOC (i.e., the third insulating film 4) and $SiO_2$ (i.e., the fourth insulating film 5).

It is therefore an object of the present invention to provide a semiconductor device which includes an insulating film having a low dielectric constant and excellent quality and exhibits reduced parasitic capacitance between interconnects, and a method for fabricating the semiconductor device.

To achieve the object, a semiconductor device according to the present invention includes: a semiconductor substrate; a first insulating film formed on the semiconductor substrate, having a first trench, and having a composition ratio varying along the depth from an upper face of the first insulating film; a first metal interconnect filling the first trench. The mechanical strength in an upper portion of the first insulating film is higher than that in the other portion of the first insulating film.

This semiconductor device includes the first insulating film whose mechanical strength in its upper portion is higher than that in the other portion so that damage on the upper face of the first insulating film is suppressed in, for example, a CMP process for forming the first metal interconnect in the first insulating film. Accordingly, even when a low-κ film generally having low strength is used as the first insulating film, the high mechanical strength in the upper portion makes the first insulating film less susceptible to damage during a fabrication process. Thus, the present invention provides a semiconductor device which includes an insulating film with excellent quality, has reduced parasitic capacitance between interconnects, is operable at high speed, and have high reliability.

A method for fabricating a semiconductor device according to the present invention includes the steps of: (a) forming a first insulating film on a semiconductor substrate; (b) processing the first insulating film in such a manner that a composition ratio of at least an upper portion of the first insulating film is different from that in the other portion of the first insulating film; and (c) forming a first trench through the first insulating film, filling the first trench with a conductive film, and performing polishing, thereby forming a first metal interconnect, after step (b).

In this method, the process of changing the composition ratio of the first insulating film is performed at step (b). Thus, when a silicon oxide film having a low dielectric constant and containing carbon is used as the first insulating film, for example, the carbon content in the upper portion of the first insulating film is lower than that in the other portion thereof. Accordingly, the mechanical strength in the upper portion of the first insulating film is greater than that in the other portion, thus suppressing damage on the surface of the first insulating film in polishing for forming a first metal interconnect in step (c). As a result, even without a CMP damage preventing film, it is possible to suppress damage on the first insulating film during a fabrication process, thus obtaining a semiconductor device with excellent quality. The inventive method for fabricating a semiconductor device allows a semiconductor device which has reduced parasitic capacitance between interconnects, is operable at high speed, and has high reliability to be relatively easily fabricated.

DETAILED DESCRIPTION OF THE INVENTION EMBODIMENT

Figure 1:
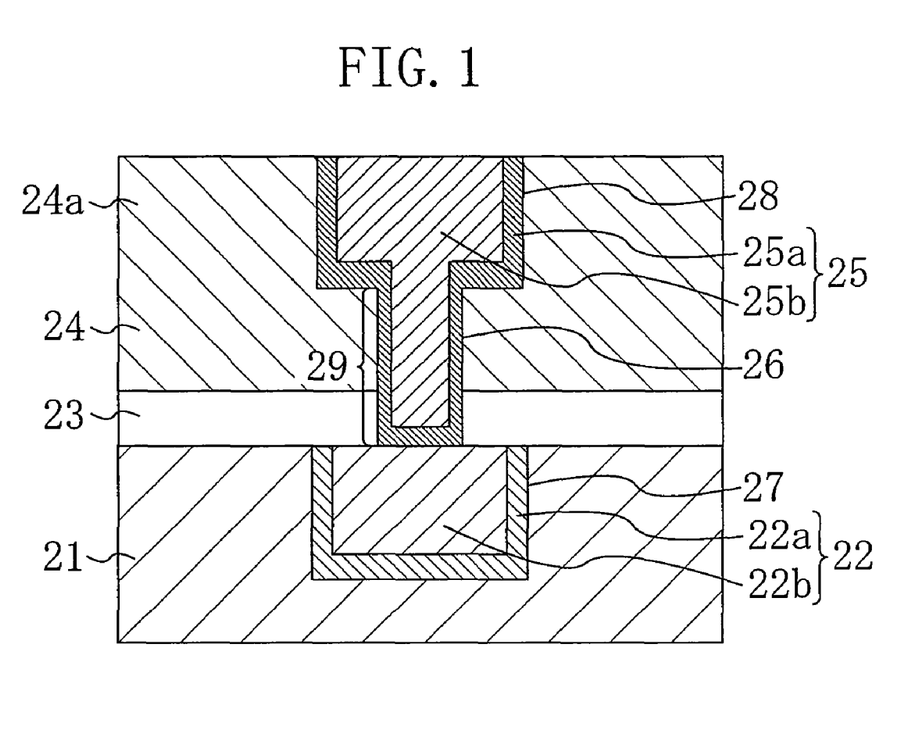
FIG. 1 is a cross-sectional view showing a structure of a semiconductor device according to an embodiment of the present invention.

A semiconductor device according to an embodiment of the present invention will be described with reference to the drawings. FIG. 1 is a cross-sectional view showing a structure of the semiconductor device of this embodiment.

As illustrated in FIG. 1, the semiconductor device of this embodiment includes: a substrate (not shown) made of, for example, Si; a first insulating film 21 which is formed on the substrate and made of, for example, silicon dioxide ($SiO_2$) and in which a first interconnect trench 27 is formed in its upper portion; and a first metal interconnect 22 buried in the first interconnect trench 27. The first metal interconnect 22 is constituted by a barrier metal 22a formed on the inner face of the first interconnect trench 27 and made of, for example, tantalum nitride (TaN) and a conductive film 22b formed on the barrier metal 22a and made of, for example, copper (Cu).

The semiconductor device of this embodiment further includes: a second insulating film 23 formed on the first insulating film 21 and the first metal interconnect 22 and made of, for example, silicon carbide (SiC); and a third insulating film 24 formed on the second insulating film 23 and made of a low-κ film such as a SiOC film. A via hole 26 is formed in the second insulating film 23 and a lower portion of the third insulating film 24. A second interconnect trench 28 is formed in an upper portion of the third insulating film 24 and is connected to the via hole 26. The semiconductor device of this embodiment further includes: a metal via 29 constituted by a barrier metal 25a formed on the inner face of the via hole 26 and made of, for example, TaN and a conductive film 25b made of, for example, Cu; and a second metal interconnect 25 constituted by the barrier metal 25a formed on the inner face of the second interconnect trench 28 and the conductive film 25b made of, for example, Cu and connected to the first metal interconnect 22 via the metal via 29. In the case of using, for example, Cu as a material for the first metal interconnect 22, the second insulating film 23 serves as a metal prevention film for preventing diffusion of Cu.

In the semiconductor device of this embodiment, though the third insulating film 24 is a carbon-containing silicon oxide (SiOC) film, the content of C in the upper portion 24a is lower than that in the other portion. Specifically, regarding the atomic percentage of atoms (composition ratio) obtained by X-ray photoelectron spectroscopy (XPS), Si:O:C=32:44:24 in the upper portion 24a of the third insulating film 24, whereas Si:O:C=30:41:29 in the other portion. In this manner, in the third insulating film 24 whose composition ratio varies along the depth, the mechanical strength in the upper portion 24a having a low carbon content is higher than that in the other portion.

A feature of the semiconductor device of this embodiment is that the second metal interconnect 25 is formed and the carbon content in the upper portion 24a of the third insulating film 24 of the low-κ film is lower than that in the other portion. Accordingly, the mechanical strength in the upper portion 24a of the third insulating film 24 is higher than that in the other portion. Thus, the upper portion 24a of the third insulating film 24 has sufficient strength, even though the third insulating film 24 is a low-κ film. This structure reduces damage on the upper face of the third insulating film 24 during, for example, a CMP process for forming a buried interconnect (i.e., the second metal interconnect 25) in the third insulating film 24. As a result, a semiconductor device which includes a high-quality low-κ film, has reduced parasitic capacitance, is operable at high speed, and has high reliability is implemented.

Now, a method for fabricating a semiconductor device according to this embodiment will be described. FIGS. 2A through 2E are cross-sectional views showing a method for fabricating a semiconductor device of this embodiment.

Figure 2A:
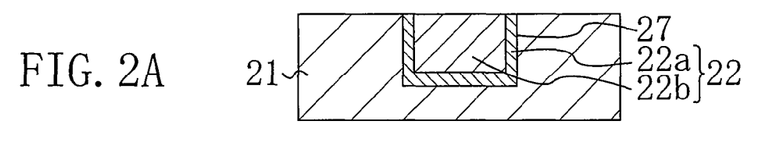
FIGS. 2A through 2E are cross-sectional views showing a method for fabricating a semiconductor device of the embodiment.

First, as shown in FIG. 2A, a first insulating film 21 made of, for example, $SiO_2$ is formed on a substrate (not shown), and then a resist is provided on the first insulating film 21 so that an interconnect trench pattern is formed on the resist by photolithography. Thereafter, using the resist as a mask, the first insulating film 21 is selectively etched by dry etching, thereby forming a first interconnect trench 27. Subsequently, the resist is removed by ashing and a barrier metal 22a made of, for example, TaN is formed on the inner face of the first interconnect trench 27, and then a conductive film 22b made of, for example, Cu is deposited on the barrier metal 22a to fill the first interconnect trench 27. Then, redundant Cu extending over the first interconnect trench 27 is removed by chemical mechanical polishing (CMP), thereby forming a first metal interconnect 22 constituted by the barrier metal 22a and the conductive film 22b.

Figure 2B:
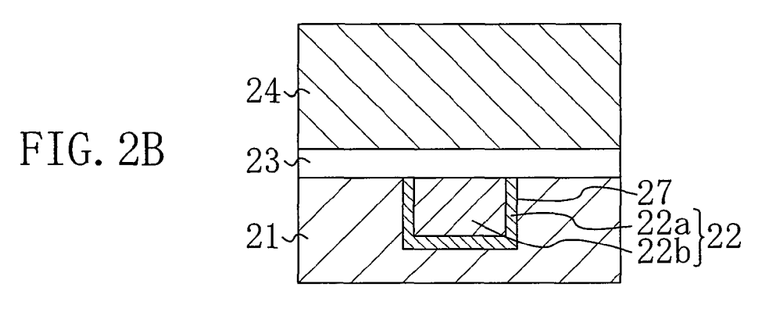

Next, as shown in FIG. 2B, a second insulating film 23 made of, for example, SiC is deposited by, for example, chemical vapor deposition (CVD) over the first insulating film 21 and the first metal interconnect 22 to a thickness of 50 nm. Subsequently, a third insulating film 24 of a low-κ film such as a SiOC film is deposited by CVD over the second insulating film 23 to a thickness of 550 nm using a gas containing organosilane or organosiloxane. In this manner, the third insulating film 24 containing a large number of methyl groups ($—CH_3$) is formed.

Figure 2C:
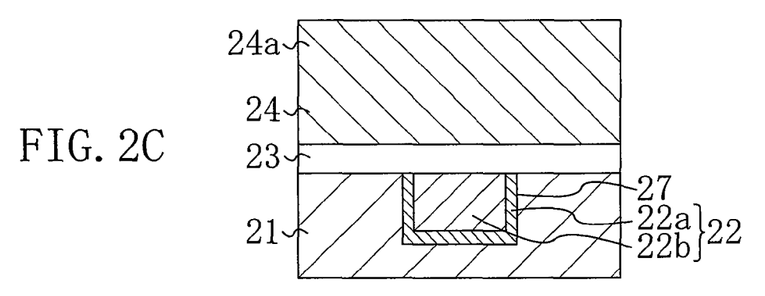

Thereafter, as shown in FIG. 2C, the substrate is placed in a vacuum chamber (not shown) provided with an ultraviolet (UV) irradiation source so that the third insulating film 24 is UV-irradiated in a gas atmosphere containing helium (He) or argon (Ar). In this manner, the composition ratio of SiOC changes in a surface portion (i.e., the upper portion 24a) of the third insulating film 24 subjected to UV irradiation.

Figure 3A:
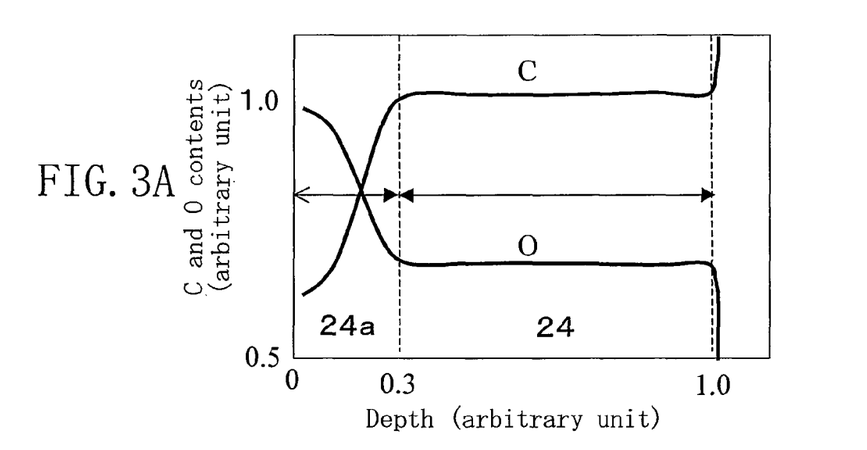
FIGS. 3A through 3C show measurement results of distribution of carbon (C) and oxygen (O) contents along the depth of the third insulating film 24 in the method of the embodiment.

The carbon content in the third insulating film 24 along the depth after UV irradiation is now described. FIG. 3A shows a measurement result of distribution of carbon (C) and oxygen (O) contents along the depth of the third insulating film 24 after UV irradiation in the method of this embodiment. As shown in FIG. 3A, the carbon content is almost constant in the third insulating film 24, but starts to greatly decrease at a depth of about 1/3 toward the surface (of the upper portion 24a). In this manner, the UV irradiation reduces the carbon content in the upper portion 24a of the third insulating film 24 below the carbon content in the other portion.

Figure 2D:
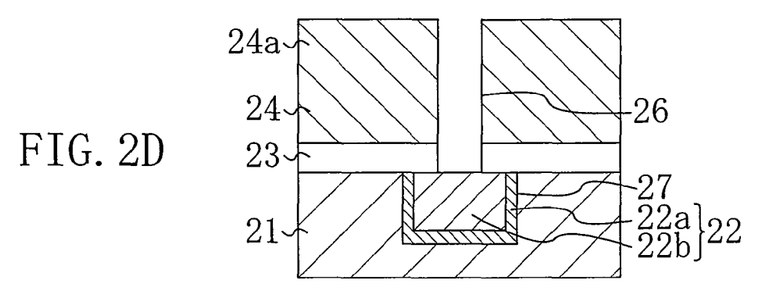

Thereafter, as shown in FIG. 2D, a resist is applied onto the upper face of the third insulating film 24 so that a pattern is formed by lithography. Using the pattern as a mask, a via hole 26 penetrating through the third insulating film 24 and the second insulating film 23 to reach the upper face of the first metal interconnect 22 is formed, and then the resist is removed by ashing.

Figure 2E:
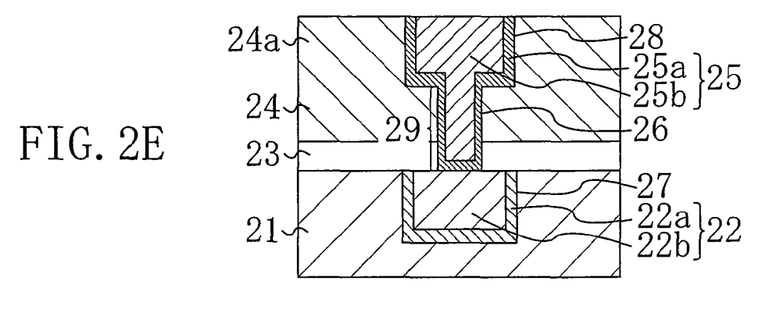

Then, as shown in FIG. 2E, a resist is applied onto the upper face of the third insulating film 24 again so that an interconnect trench pattern is formed by lithography. Using the pattern as a mask, an upper portion of the third insulating film 24 surrounding the via hole 26 is removed, thereby forming a second interconnect trench 28. Subsequently, a barrier metal 25a made of, for example, TaN is formed by sputtering on the inner faces of the via hole 26 and the second interconnect trench 28. Thereafter, a conductive film 25b made of, for example, Cu is formed by electroplating on the barrier metal 25a to be buried in the via hole 26 and the second interconnect trench 28. Then, redundant Cu extending over the second interconnect trench 28 is removed by chemical mechanical polishing (CMP), thereby forming a metal via 29 and a second metal interconnect 25 each constituted by the barrier metal 25a and the conductive film 25b at a time. In this process step, a dual damascene process in which cupper is deposited and buried in the second interconnect trench 28 and the via hole 26 at the same time is employed. However, the present invention is not limited to this. With the foregoing method, a semiconductor device of this embodiment is fabricated.

Figure 4:
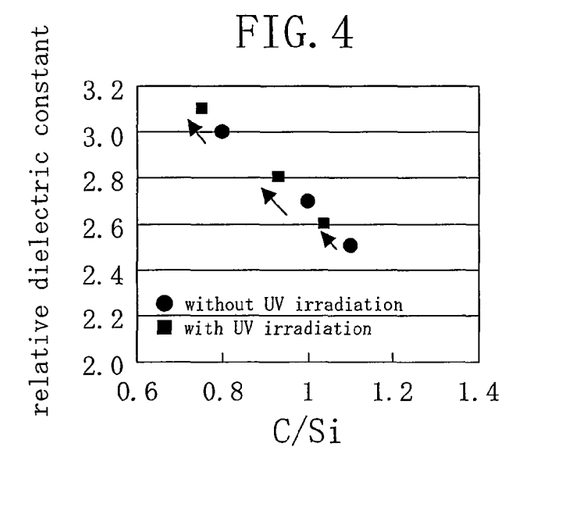
FIG. 4 is a graph showing a relationship between a C/Si ratio and a relative dielectric constant in a SiOC film in the method of the embodiment.
Figure 5:
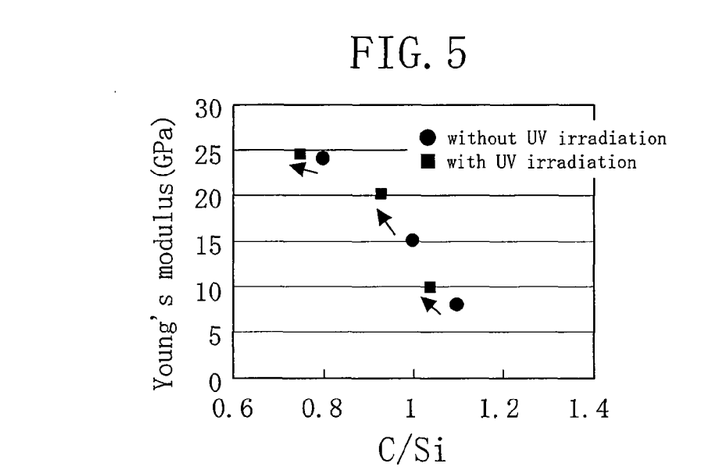
FIG. 5 is a graph showing a relationship between the C/Si ratio and a Young's modulus (GPa) in the SiOC film in the method of the embodiment.

In the method for fabricating a semiconductor device of this embodiment, the third insulating film 24 is a SiOC film having a low dielectric constant and formed by CVD. A relationship between the ratio of C with respect to Si (i.e., the C/Si ratio) and each of the relative dielectric constant and the Young's modulus in the SiOC film deposited by CVD is now described with reference to FIGS. 4 and 5, respectively. FIG. 4 is a graph showing a relationship between the C/Si ratio and the relative dielectric constant in the SiOC film in the method of this embodiment. FIG. 5 is a graph showing a relationship between the C/Si ratio and the Young's modulus (GPa) in the SiOC film in the method of this embodiment. In FIGS. 4 and 5, the SiOC films having different C/Si ratios are obtained by CVD using a gas containing organosiloxane under different deposition conditions. Results obtained without UV irradiation (a) and with UV irradiation (b) are both shown.

Now, a result obtained without UV irradiation (a) is described. As shown in FIG. 4, the relative dielectric constant decreases as the carbon content in the SiOC film increases. The decrease of the relative dielectric constant is caused by increase in percentage of methyl groups in the film. On the other hand, as shown in FIG. 5, as the carbon content in the SiOC film increases, the Young's modulus decreases. This shows that as the Young's modulus increases, the amount of distortion by stress increases. Accordingly, considering the fact that with increase of the carbon content in the SiOC film, the relative dielectric constant decreases and the Young's modulus decreases as shown in FIGS. 4 and 5, it is concluded that the low-κ film is susceptible to damage such as a scratch during, for example, CMP.

Next, a result obtained with UV irradiation (b) is described. The UV irradiation is performed at, for example, a temperature of 300° C. to 450° C. and a pressure of $1 \times 10^{-8}$ Pa to $1.01 \times 10^5$ Pa (1 atm) in a nitrogen atmosphere containing nitrogen and one or more other elements with an UV power of 1 kW to 10 kW for, for example, 240 seconds to 1200 seconds.

FIGS. 4 and 5 show that UV irradiation of the SiOC film reduces the carbon content and, thus, increases both of the relative dielectric constant and the Young's modulus. This is considered to be because the UV irradiation of the SiOC film causes methyl groups in this film to be eliminated with the energy of the UV irradiation so that the dielectric constant increases and the strong bond of the basic skeleton causes the Young's modulus to increase.

Accordingly, as shown in FIG. 3A, the carbon content in the upper portion 24a is lower than that in the other portion (i.e., the inside) of the third insulating film 24 formed with the method of this embodiment so that the Young's modulus in the upper portion 24a is higher than that in the other portion (i.e., the inside) of the film. That is, the mechanical strength in the upper portion 24a is higher than that in the other portion (i.e., the inside) of the third insulating film 24. The third insulating film 24 has a relative dielectric constant of 3.5 or less. Thus, the effect of reducing parasitic capacitance between interconnects is still obtained even after UV irradiation.

Figure 6:
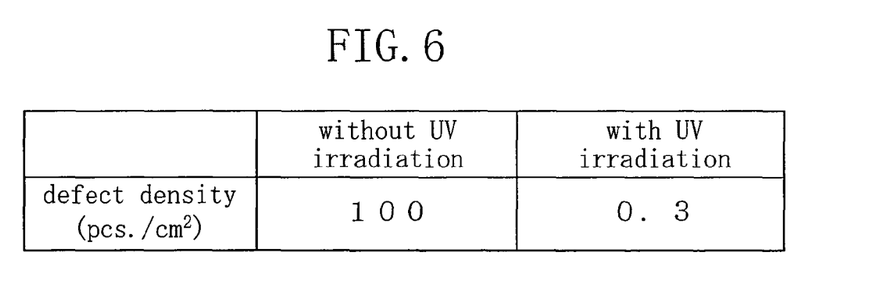
FIG. 6 is a table showing a defect density in a third insulating film in the method of the embodiment.

FIG. 6 shows a result of defect detection performed on the surface of the insulating film in order to confirm the effect of the third insulating film 24 having the foregoing characteristics. FIG. 6 is a graph showing the defect density in the third insulating film 24 in the method of this embodiment. For comparison, a sample subjected to process steps up to the CMP process performed on an insulating film formed without UV irradiation is prepared, and the defect density of the sample is also obtained by performing the same defect detection.

As shown in FIG. 6, the defect density in the surface (i.e., the upper portion 24a) of the third insulating film 24 formed with UV irradiation in the method of this embodiment is significantly reduced, as compared to the case of no UV irradiation. Thus, it is concluded that the third insulating film 24 formed with the method of this embodiment has a high resistance to damage during the CMP process.

As described above, the method of this embodiment is characterized in that the third insulating film 24 is processed in such a manner that the composition ratio in its upper portion becomes different from that in the other portion in the process step shown in FIG. 2C. Then, when the third insulating film 24 is a silicon oxide film containing, for example, carbon and has a low dielectric constant, the carbon content in its upper portion is lower than that in the other portion so that the mechanical strength in the upper portion is higher than that in the other portion. As a result, no CMP damage preventing film is necessary, and damage on the surface of the third insulating film is suppressed in fabrication processes such as a CMP process shown in FIG. 2E, thus obtaining a low-κ film with excellent quality. Accordingly, the method for fabricating a semiconductor device of this embodiment allows a high-speed semiconductor device having reduced parasitic capacitance between interconnects to be relatively easily fabricated.

Unlike a conventional method for fabricating a semiconductor device, it is unnecessary to form a CMP damage preventing film on the low-κ film in the method of this embodiment, thus eliminating drawbacks such as peeling at the interface between the CMP damage preventing film and the low-κ film.

In the method of this embodiment, UV irradiation is performed as a process for changing the composition ratio of the upper portion 24a of the third insulating film 24 in the process step shown in FIG. 2C. However, the present invention is not limited to this. As this process, one of the following three processes may be employed, for example.

Figure 3B:
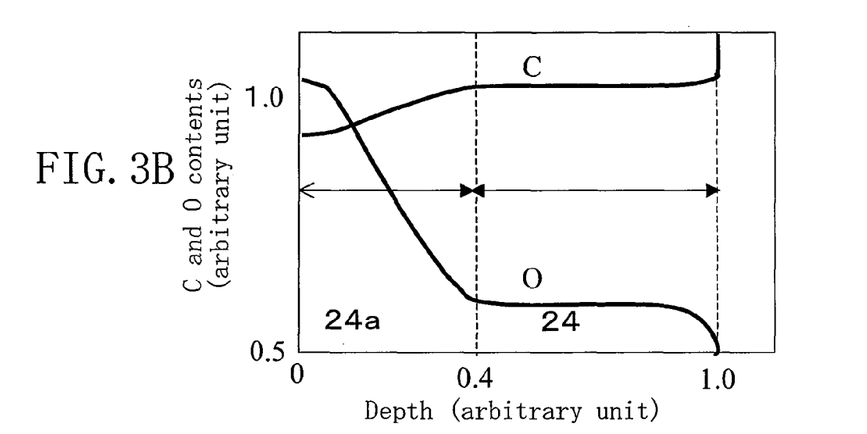

A first method is that the third insulating film 24 is irradiated with an electron beam. FIG. 3B shows a measurement result of distribution of carbon (C) and oxygen (O) contents along the depth of the third insulating film 24 after electron beam irradiation. As shown in FIG. 3B, with the electron beam irradiation, the carbon content in the third insulating film 24 is almost constant in the inside of the third insulating film 24, but starts to gradually decrease toward the surface (of the upper portion 24a) at a depth of about a half of the whole third insulating film 24. This shows that the electron beam irradiation reduces the carbon content in the upper portion 24a of the third insulating film 24 so that the Young's modulus decreases. Accordingly, the electron beam irradiation also enables formation the third insulating film 24 whose mechanical strength in its upper portion is higher than that in the other portion, thus obtaining the same advantages as those described above. In this electron beam irradiation, the oxygen content is significantly high in the surface of the third insulating film 24. In the third insulating film 24 having such a composition ratio, the etching rate in the upper portion 24a is greatly different from that near a lower portion of the third insulating film 24. Accordingly, the insulating film subjected to the electron beam irradiation has a higher resistance to polishing in the CMP process. The electron beam irradiation is performed at, for example, a temperature of 300° C. to 450° C. and a pressure of $1\times10^{-8}$ Pa to $1\times10^{-4}$ Pa in a helium atmosphere with an electron beam power of 10 kW to 30 kW for, for example, 60 seconds to 180 seconds.

Figure 3C:
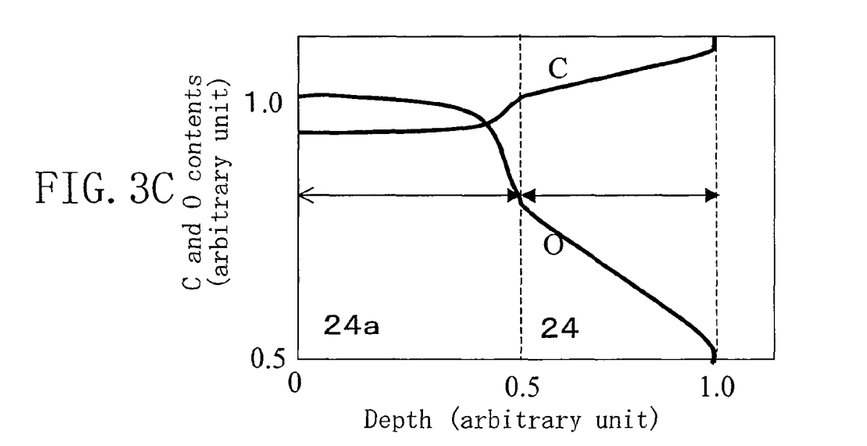

A second method is that the third insulating film 24 is exposed to a heat source. FIG. 3C shows a measurement result of distribution of carbon (C) and oxygen (O) contents along the depth of the third insulating film 24 after heat exposure. As shown in FIG. 3C, with the heat exposure, the carbon content in the third insulating film 24 gradually decreases as the depth of the film decreases and the carbon content in the surface (i.e., the upper portion 24a) is lower than in the other portion. Accordingly, the heat exposure process also allows formation of the third insulating film 24 whose mechanical strength in its upper portion is higher than that in the other portion, thus obtaining the same advantages as those described above. The heat exposure is performed at a temperature of 600° C. to 1200° C. and a pressure of $1\times10^{-4}$ Pa to $1.01\times10^{5}$ Pa (1 atm) in a helium, nitrogen or hydrogen atmosphere for 10 minutes to 30 minutes.

Lastly, a third method is that a prism is provided on the surface of the third insulating film 24 so that the surface of the third insulating film 24 is processed using an evanescent wave produced by irradiating the prism with UV irradiation. In this case, the carbon content in the upper portion 24a of the third insulating film 24 is also lower than that in the other portion, and thus the same advantages as those described above are obtained. The UV irradiation is performed at a temperature of 300° C. to 450° C. and a pressure of $1\times10^{-8}$ Pa to $1.01\times10^{5}$ Pa (1 atm) in a nitrogen atmosphere containing nitrogen and one or more other elements with a UV power of 1 kW to 10 kW for 240 seconds to 1200 seconds.

In the method of this embodiment, the third insulating film 24 is formed by CVD. However, the present invention is not limited to this. The third insulating film 24 may be formed by applying a material containing Si, O and C, such as methyl silsesquioxane (MSQ) or methyl hydrogen silsesquioxane (MHSQ). In this case, the process step shown in FIG. 2C allows the same advantages as those described above to be also obtained.

A semiconductor device and a method for fabricating a semiconductor device according to the present invention are useful for increasing the speed of driving a semiconductor device.

What is claimed is:

1. A method for fabricating a semiconductor device, the method comprising the steps of:
   (a) forming a first insulating film on a semiconductor substrate;
   (b) processing the first insulating film in such a manner that a composition ratio of at least an upper portion of the first insulating film is different from that in the other portion of the first insulating film; and
   (c) forming a first trench through the first insulating film, filling the first trench with a conductive film, and performing polishing, thereby forming a first metal interconnect, after step (b),
   wherein in step (b), an upper face of the first insulating film is exposed to ultraviolet irradiation so that a composition ratio of the first insulating film changes.

2. The method of claim 1, wherein after step (b), mechanical strength of the upper portion of the first insulating film is higher than that of the other portion of the first insulating film.

3. The method of claim 1, wherein
   the first insulating film is a silicon oxide film containing carbon, and
   after step (b), a carbon content in the upper portion of the first insulating film is lower than that in the other portion of the first insulating film.

4. The method of claim 1, further including, before step (a), the steps of:
   (d1) forming a second insulating film having a second trench on the semiconductor substrate; and
   (d2) filling the second trench with a conductive film and performing polishing, thereby forming a second metal interconnect, after step (d1),
   wherein in step (a), the first insulating film is formed on the second insulating film and the second metal interconnect, and
   in step (c), the first trench is formed to reach an upper face of the second metal interconnect so that the first metal interconnect is electrically connected to the second metal interconnect.

5. The method of claim 4, further including the step of: (d3) forming a third insulating film on the second insulating film and the second metal interconnect, after step (d2) and before step (a),
   wherein the second metal interconnect is made of copper,
   in step (a), the first insulating film is formed on the third insulating film, and
   in step (c), the first trench is formed through the first insulating film and the third insulating film.

6. The method of claim 1, wherein in step (b), UV irradiation is performed at a temperature of 300° C. to 450° C. and a pressure of $1 \times 10^{-8}$ Pa to $1.01 \times 10^5$ Pa.

7. A method for fabricating a semiconductor device, the method comprising the steps of:
   (a) forming a first insulating film on a semiconductor substrate;
   (b) processing the first insulating film in such a manner that a composition ratio of at least an upper portion of the first insulating film is different from that in the other portion of the first insulating film; and
   (c) forming a first trench through the first insulating film, filling the first trench with a conductive film, and performing polishing, thereby forming a first metal interconnect, after step (b),
   wherein in step (b), an upper face of the first insulating film is exposed to an electron beam so that a composition ratio of the first insulating film changes.

8. The method of claim 7, wherein after step (b), mechanical strength of the upper portion of the first insulating film is higher than that of the other portion of the first insulating film.

9. The method of claim 7, wherein
   the first insulating film is a silicon oxide film containing carbon, and
   after step (b), a carbon content in the upper portion of the first insulating film is lower than that in the other portion of the first insulating film.

10. The method of claim 7, further including, before step (a), the steps of:
   (d1) forming a second insulating film having a second trench on the semiconductor substrate;
   (d2) filling the second trench with a conductive film and performing polishing, thereby forming a second metal interconnect, after step (d1), and
   (d3) forming a third insulating film on the second insulating film and the second metal interconnect, after step (d2) and before step (a),
   wherein in step (a), the first insulating film is formed on the second insulating film and the second metal interconnect,
   in step (c), the first trench is formed to reach an upper face of the second metal interconnect so that the first metal interconnect is electrically connected to the second metal interconnect,
   the second metal interconnect is made of copper,
   in step (a), the first insulating film is formed on the third insulating film, and
   in step (c), the first trench is formed through the first insulating film and the third insulating film.

11. The method of claim 7, wherein in step (b), electron beam irradiation is performed at a temperature of 300° C. to 450° C. and a pressure of $1 \times 10^{-8}$ Pa to $1 \times 10^{-4}$ Pa.

12. A method for fabricating a semiconductor device, the method comprising the steps of:
   (a) forming a first insulating film on a semiconductor substrate;
   (b) processing the first insulating film in such a manner that a composition ratio of at least an upper portion of the first insulating film is different from that in the other portion of the first insulating film; and
   (c) forming a first trench through the first insulating film, filling the first trench with a conductive film, and performing polishing, thereby forming a first metal interconnect, after step (b),
   wherein in step (b), an upper face of the first insulating film is exposed to a heat source so that a composition ratio of the first insulating film changes.

13. The method of claim 12, wherein after step (b), mechanical strength of the upper portion of the first insulating film is higher than that of the other portion of the first insulating film.

14. The method of claim 12, wherein
   the first insulating film is a silicon oxide film containing carbon, and
   after step (b), a carbon content in the upper portion of the first insulating film is lower than that in the other portion of the first insulating film.

15. The method of claim 12, further including, before step (a), the steps of:
   (d1) forming a second insulating film having a second trench on the semiconductor substrate;

(d2) filling the second trench with a conductive film and performing polishing, thereby forming a second metal interconnect, after step (d1), and (d3) forming a third insulating film on the second insulating film and the second metal interconnect, after step (d2) and before step (a), wherein in step (a), the first insulating film is formed on the second insulating film and the second metal interconnect, in step (c), the first trench is formed to reach an upper face of the second metal interconnect so that the first metal interconnect is electrically connected to the second metal interconnect, the second metal interconnect is made of copper, in step (a), the first insulating film is formed on the third insulating film, and in step (c), the first trench is formed through the first insulating film and the third insulating film.

16. The method of claim 12, wherein in step (b), heat exposure is performed at a temperature of 600° C to 1200° C and a pressure of $1\times10^{-4}$ Pa to $1.01\times10^5$ Pa.

17. A method for fabricating a semiconductor device, the method comprising the steps of:

(a) forming a first insulating film on a semiconductor substrate;

(b) processing the first insulating film in such a manner that a composition ratio of at least an upper portion of the first insulating film is different from that in the other portion of the first insulating film; and (c) forming a first trench through the first insulating film, filling the first trench with a conductive film, and performing polishing, thereby forming a first metal interconnect, after step (b), wherein in step (b), an upper face of the first insulating film is exposed to an evanescent wave produced by irradiating a prism with ultraviolet irradiation so that a composition ratio of the first insulating film changes.

18. The method of claim 17, wherein after step (b), mechanical strength of the upper portion of the first insulating film is higher than that of the other portion of the first insulating film.

19. The method of claim 17, wherein the first insulating film is a silicon oxide film containing carbon, and after step (b), a carbon content in the upper portion of the first insulating film is lower than that in the other portion of the first insulating film.

20. The method of claim 17, further including, before step (a), the steps of:

(d1) forming a second insulating film having a second trench on the semiconductor substrate;

(d2) filling the second trench with a conductive film and performing polishing, thereby forming a second metal interconnect, after step (d1), and (d3) forming a third insulating film on the second insulating film and the second metal interconnect, after step (d2) and before step (a), wherein in step (a), the first insulating film is formed on the second insulating film and the second metal interconnect, in step (c), the first trench is formed to reach an upper face of the second metal interconnect so that the first metal interconnect is electrically connected to the second metal interconnect, the second metal interconnect is made of copper, in step (a), the first insulating film is formed on the third insulating film, and in step (c), the first trench is formed through the first insulating film and the third insulating film.

* * * * *